United States Patent [19]
Chang et al.

[11] 3,784,925
[45] Jan. 8, 1974

[54] BROADBAND APPARATUS USING HIGH EFFICIENCY AVALANCHE DIODES OPERATIVE IN THE ANOMALOUS MODE

[75] Inventors: Kern Ko Nan Chang, Princeton; Hans John Prager, Belle Mead, both of N.J.; Sherman Weisbrod, Morrisville, Pa.

[73] Assignee: RCA Corporation, New York, N.Y.

[22] Filed: Oct. 8, 1971

[21] Appl. No.: 187,742

[52] U.S. Cl. ........................ 330/34, 330/24, 330/53
[51] Int. Cl. ........................ H03f 3/10
[58] Field of Search ........................ 330/34, 61 A; 333/80

[56] References Cited

UNITED STATES PATENTS

| | | | |
|---|---|---|---|
| 3,327,240 | 6/1967 | Grabowski | 330/34 X |
| 3,634,849 | 1/1972 | Nishizawa et al. | 333/80 X |
| 3,673,514 | 6/1972 | Coleman, Jr. et al. | 330/34 X |
| 3,187,266 | 6/1965 | Marshall, Jr. | 330/34 |
| 3,509,465 | 4/1970 | Andre et al. | 330/34 X |
| 3,300,729 | 1/1967 | Chang | 330/34 X |

*Primary Examiner*—Nathan Kaufman
*Attorney*—Edward J. Norton, Joseph D. Lazar & Donald E. Mahoney

[57] ABSTRACT

The frequency bandwidth of a microwave apparatus using an avalanche diode operating in the anomalous mode is increased by providing a frequency insensitive current path at frequencies harmonically related to the desired frequency bandwidth.

8 Claims, 4 Drawing Figures

INVENTORS
Kern K. N. Chang,
Hans J. Prager &
Sherman Weisbrod
BY Edward J. Norton
ATTORNEY

BROADBAND APPARATUS USING HIGH EFFICIENCY AVALANCHE DIODES OPERATIVE IN THE ANOMALOUS MODE

The invention herein described was made in the course of or under a contract or subcontract thereunder with the Department of the Air Force.

DESCRIPTION OF THE PRIOR ART

A one port reflection type amplifier using an avalanche diode operating in the anomalous mode has been disclosed by Chang, Prager and Weisbord in an allowed United States Pat. No. 3,588,735, issued June 28, 1971 and assigned to the same assignee as the present invention. The avalanche diode is a negative resistance semiconductive device that generates microwave energy under certain operating conditions. One of these conditions is that the avalanche diode be coupled to a microwave circuit that provides a current path at frequencies harmonically related to a desired band of frequencies. The current path in prior art devices is through a reactive impedance. Usually the current path is in the form of a distributed stub or filter circuit. The current path provided by a reactive impedance is sensitive to changes in the desired operating frequency. Thus, an amplifier using an avalanche diode operating in the anomalous mode has a typical operating bandwidth of only one percent.

SUMMARY OF THE INVENTION

The terminals of a negative resistance semiconductive device operative in the anomalous mode are connected in shunt across a transmission line and ground in a microwave apparatus. The diode terminals are connected to the transmission line at a relatively high microwave voltage point. A reverse bias signal exceeding a predetermined threshold magnitude is applied across the diode terminals. The bias signal causes the diode to generate microwave energy in its anomalous mode of operation.

A frequency dependent load is connected to the transmission line. The load reflects microwave energy at frequencies within a desired bandwidth. The load also absorbs microwave energy at frequencies harmonically related to the desired band of frequencies. The diode generated microwave energy within a desired frequency bandwidth is coupled from the microwave apparatus.

These and other features and advantages of the invention will be better understood from a consideration of the following specification taken in conjunction with the accompanying drawing in which:

DESCRIPTION OF THE PREFERRED EMBODIMENT

Figure 1:
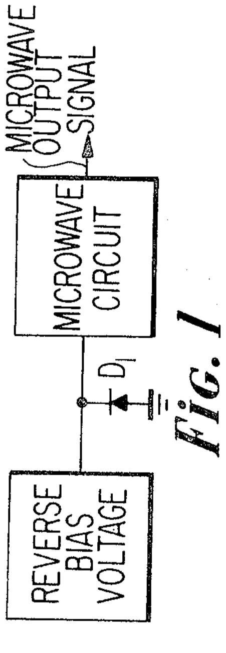
FIG. 1 is a block diagram of a microwave apparatus using an avalanche diode operating in the anomalous mode.

Referring to FIG. 1, there is shown a block diagram of a microwave or R.F. apparatus using an avalanche diode, $D_1$, operating in the high efficiency or anomalous mode. An avalanche diode is a two terminal negative resistance semiconductive device. A displacement current or electric field is created in the depletion layer of the semiconductive material when an appropriate reverse bias voltage is applied across the diode terminals. The magnitude of the reverse bias voltage is slightly greater than the breakdown voltage of the diode. As a result of the applied reverse bias voltage, diode carriers are ionized at the point of maximum electric field within the depletion layer. The carrier density is increased when the ionized carriers collide with other atoms and create more carriers. The displacement current can also be considered as a wavefront, moving with specific wave velocity, provided the displacement current has a very fast rise time. If the wave velocity of the displacement current is greater than the saturation velocity of the carriers, a high density of holes and electrons will be left in the wake of this wavefront. As a result of the concentration of holes and electrons, the electric field is reduced and the velocity of the carriers is diminished, leading to the formation of a dense plasma. Microwave energy is obtained from an avalanche diode by extraction of energy from the trapped plasma.

The necessary fast rise time of the displacement current can be achieved by utilizing the high frequency signals created by ionization at low currents. The high frequency signals trigger the avalanche diode into a high efficiency mode of operation, the anomalous mode. The operating frequency of an avalanche diode apparatus is related to the ratio of the depletion layer width to the velocity of the carriers in the plasma, and the design of the complementary microwave circuitry. It is desirable to connect the diode, $D_1$, at a relatively high microwave voltage point within the microwave circuit. The microwave circuit must also provide a current path for microwave signals at frequencies harmonically related to a desired frequency or band of frequencies. If the existence of the current path for these microwave signals is sensitive to changes in frequency, then the bandwidth of the diode generated microwave energy is limited.

Figure 2:
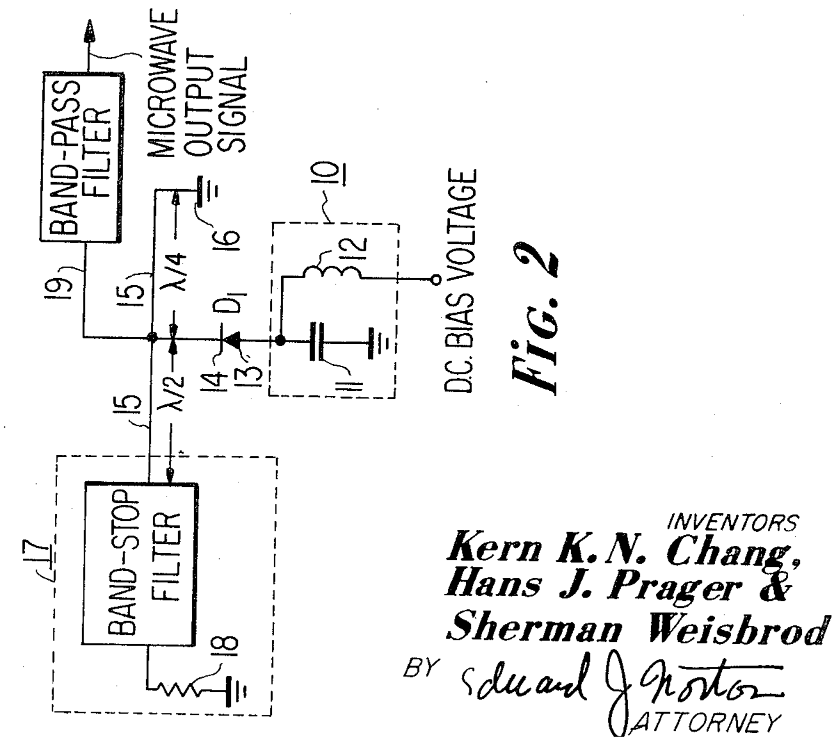
FIG. 2 is a schematic of a microwave oscillator according to one embodiment of the invention.

Referring to FIG. 2, there is shown a schematic of a microwave oscillator capable of continuously generating microwave energy over a predetermined band of frequencies. A reverse D.C. bias voltage is coupled from a source, not shown, and applied across the terminals of diode $D_1$ via the D.C. bias circuit 10. The magnitude of the applied D.C. voltage exceeds the breakdown voltage of diode $D_1$. The D.C. bias circuit 10 may consist of a low pass filter formed by the combination of a relatively low impedance capacitor 11 and a relatively high impedance inductor 12. The D.C. bias circuit 10 is a block for R.F. signals. One end of the inductor 12 is connected to the anode 13 of diode $D_1$, and the D.C. bias voltage is coupled to the other end of the inductor 12. The cathode 14 of diode $D_1$ is connected to a microwave transmission line 15 terminated at one end by a short circuit 16 and at the other end by a frequency dependent load 17. It is desirable to connect the diode $D_1$ to the microwave transmission line 15 at a relatively high microwave voltage point. This is accomplished by connecting the cathode 14 to the transmission line 15 at a point that is electrically $\lambda/4$ from the short circuit 16, where $\lambda$ is the wavelength at the center frequency, $f_0$, of a desired band of frequencies.

The frequency dependent load 17 is located along the transmission line 15 at an electrical distance $\lambda/2$ from the diode terminals, where $\lambda$ is the wavelength at the center frequency $f_0$. The impedance of the frequency dependent load 17 is reactive over the desired band of frequencies and the load 17 reflects microwave energy over this bandwidth. A frequency insensitive current path for signals at frequencies harmonically related to the desired band of frequencies is also provided by the frequency dependent load 17. The frequency dependent load 17 may consist of a two port band-stop filter, resonant over the desired band of frequencies, and having one port terminated by a microwave absorbing load 18. The microwave absorbing load 18 provides a resistive current path that is frequency insensitive.

Microwave energy is also transmitted along a second microwave transmission line 19 that contains a band-pass filter resonant over the desired band of frequencies. Microwave energy within the pass band of the band-pass filter is transmitted to a desired terminating load, not shown. The band-pass filter reflects energy outside its pass band. The energy is reflected by both the band-pass and band-stop filters is used to trigger diode $D_1$ into continuation of its anomalous mode of operation.

Figure 3:
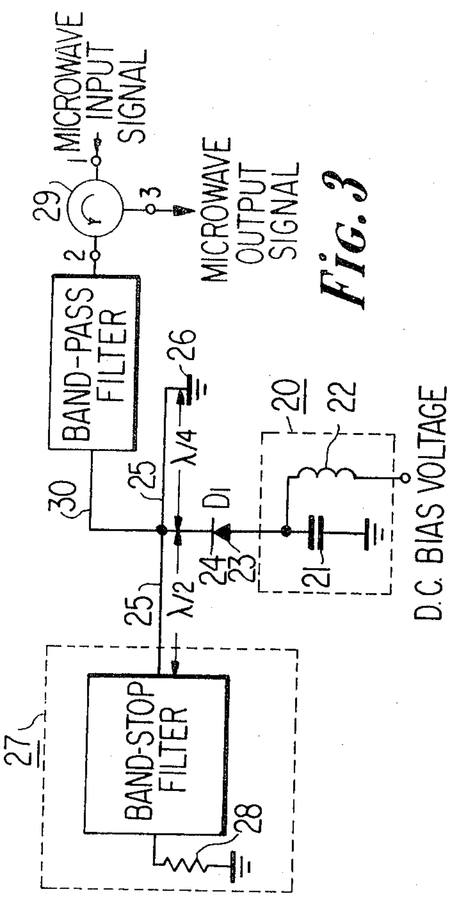
FIG. 3 is a schematic of a microwave amplifier according to one embodiment of the invention.

Referring to FIG. 3, there is shown a schematic of a microwave amplifier having an avalanche diode, $D_1$. The operating bandwidth of the amplifier is extended by use of a frequency dependent load 27. The diode $D_1$ is reverse biased by a combination of an applied D.C. voltage and microwave signal having a desired frequency bandwidth. The magnitude of neither the D.C. voltage nor the microwave voltage of the applied microwave signal exceeds the breakdown voltage of diode $D_1$. It is the magnitude of the combination of D.C. and microwave voltages that exceed the breakdown voltage of diode $D_1$. The design and function of the D.C. bias circuit 20 is similar to the bias circuit 10 of FIG. 2. A reverse D.C. bias voltage is applied across the terminals of diode $D_1$ via an inductor 22 having one end connected to the anode 23 of diode $D_1$ and the other end connected to a D.C. source not shown. The combination of capacitor 21 and inductor 22 form a low pass filter 20 that prevents the transmission of microwave signals. The cathode of $D_1$ is connected at a microwave high voltage point on a microwave transmission line 25. The microwave high voltage point is established by terminating the transmission line 25 in a short circuit 26 at an electrical distance of $\lambda/4$ from the diode terminals, where $\lambda$ is the wavelength at the center frequency, $f_0$, of the desired band of frequencies.

As in the microwave oscillator of FIG. 2, the frequency dependent load 27 provides a frequency insensitive path for currents existing at frequencies harmonically related to the desired band of frequencies. The frequency dependent load 27 also reflects energy at frequencies within the desired bandwidth. The frequency dependent load 27 may consist of a two port band-stop filter, resonant over the desired bandwidth and having one port terminated by a microwave energy absorbing load 28. The second port of the band-stop filter is separated from the terminals of diode $D_1$ by a transmission line having an electrical length of $\lambda/2$, where $\lambda$ is the wavelength at the frequency $f_0$.

The microwave energy used to bias and trigger diode $D_1$ into operation is coupled to port 1 of a three port directional device 29. Such a device may be a three port ferrite circulator 29. The directional properties of the ferrite circulator 29 transmits the applied microwave energy toward the band-pass filter terminating port 2 of the circulator 29. The band-pass filter is resonant over the bandwidth of the applied microwave energy. Therefore, the applied microwave energy is transmitted through the band-pass filter toward the diode $D_1$ along a second microwave transmission line 30. The microwave voltage of the applied microwave signal aids the applied D.C. bias voltage and the combined voltages exceeds the breakdown voltage of diode $D_1$. Diode $D_1$ is triggered into operation and the magnitude of the diode generated microwave energy exceeds the magnitude of the applied microwave energy. Part of the diode generated microwave energy is transmitted along the second transmission line 30 toward the band-pass filter. The band-pass filter transmits only the energy at frequencies within the desired bandwidth toward port 2 of the circulator 29. The directional properties of the circulator 29 continues the transmission of energy from port 2 to port 3 of the circulator 29. The magnitude of the diode generated energy that is coupled from port 3 of the circulator 29 is greater than the magnitude of the microwave input signal coupled to port 1 of the circulator 29.

Figure 4:
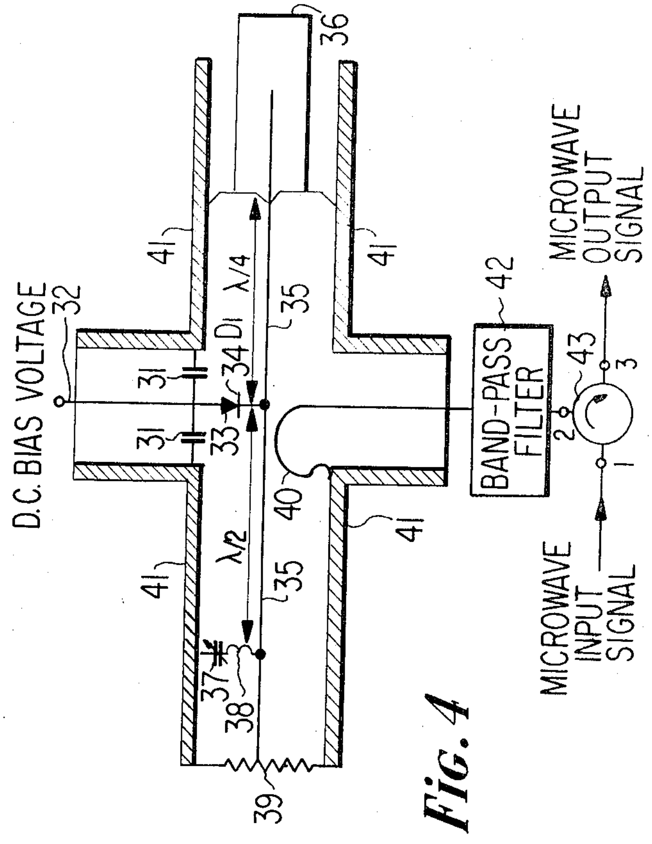
FIG. 4 is a cross section of a coaxial amplifier according to the invention.

In FIG. 4, which will now be described, there is shown the cross section of a coaxial transmission line amplifier built using the techniques of the present invention. The amplifier is designed to operate over a 5 percent frequency bandwidth centered at 2.1 GHz. The cathode 34 of avalanche diode $D_1$ is connected to the inner conductor 35 of a coaxial transmission line at a relatively high microwave voltage point. A reverse D.C. bias signal is applied across the diode terminals via the inner conductor 32 of a high impedance coaxial transmission line. A portion of the inner conductor 32 is shunted to ground or the outer conductor 41 by a coaxial type bypass capacitor 31. The combination of bypass capacitor 31 and high impedance transmission line 32 form a low-pass filter that impedes the transmission of microwave energy. A high microwave voltage point is established at the diode connection by a critically located variable short circuit 36 terminating one end of the inner conductor 35. The electrical distance between the variable short circuit 36 and the cathode 34 of $D_1$ is substantially $\lambda/4$, where $\lambda$ is the wavelength at 2.1 GHz. A series combination of a variable lumped capacitor 37 and inductor is connected from the inner conductor 35 to ground 41. The combination of capacitor and inductor form a band-stop filter tuned to resonate at 2.1 GHz. Microwave energy outside the stop-band of the band-stop filter is stop-band and of the band-stop filter attenuated by microwave absorbing material 39 also connected to the inner conductor 35. The electrical distance from the band-stop filter to the cathode 34 of $D_1$ is $\lambda/2$, where $\lambda$ is the wavelength at 2.1 GHz.

The diode $D_1$ is triggered into operation by a microwave input signal coupled to port 1 of a ferrite circulator 43. The directional properties of the ferrite circulator 43 transmits the applied microwave signal from port 1 to the band-pass filter 43 terminating port 2 of the circulator 43. The band-pass filter 42 is designed to be resonant over the bandwidth of the applied microwave signal. Therefore, the applied microwave signal is transmitted through the band-pass filter 42. A microwave coupling loop 40 connected to the band-stop filter 42 couples the applied microwave energy to the diode $D_1$. The combination of D.C. bias voltage and applied microwave signal trigger $D_1$ into operation. The inductive coupling loop 40 couples the diode generated energy at the same frequency as the input microwave signal and this energy is transmitted through the band-pass filter 42 to port 2 of the circulator 43. The directional properties of the ferrite circulator 43 transmits energy from port 2 to port 3.

The magnitude of the input microwave signal coupled to port 1 of the circulator 43 was 4 watts. The magnitude of the output microwave signal coupled from port 3 of the circulator 43 was 40 watts. The power gain of the amplifier was 10 db with a 3 db bandwidth of 5 percent. The D.C. to R.F. efficiency was 17 percent.

A preferred embodiment of the invention in coaxial transmission line has been shown and described. Various other embodiments and modifications thereof will be apparent to those skilled in the art, and will fall within the scope of invention as defined in the following claims.

What is claimed is:

1. Apparatus operative over a desired band of frequencies, said apparatus comprising:
   - a two-terminal negative resistance semiconductive device having an operative anomalous mode,
   - a transmission line having a center conductor and a ground conductor, said center conductor having first and second ends,
   - means for connecting a first terminal of said device to said center conductor,
   - means for connecting said first end of said center conductor to said ground conductor for maintaining a relatively high microwave voltage across said device terminals in the presence of a microwave signal having said desired band of frequencies,
   - bias means connected in series with said device for applying a reverse bias signal exceeding a predetermined threshold magnitude across said device terminals, to cause said device to be triggered into said anomalous mode of operation and generating microwave signals including said desired band of frequencies thereby establishing a microwave voltage between said center conductor and ground conductor and said relatively high microwave voltage across said device terminals,
   - filter means resonant over said desired band of frequencies, said filter means having first and second terminals, said first terminal being connected to said second end of said center conductor to reflect said microwave signals over said desired band of frequencies and said second filter terminal being connected to a signal absorbing means to absorb said microwave signals at all other frequencies harmonically related to said desired band of frequencies, and
   - means electrically coupled to said first terminal of said device for coupling said microwave signals over said desired band of frequencies from said device to an output port.

2. Apparatus in accordance with claim 1 further including an input port for input microwave signals, wherein said reverse bias signal includes the sum of a D.C. reverse bias voltage having a magnitude less than said predetermined threshold magnitude plus the amplitude of said microwave input signal coupled to said input port, said microwave input signal containing said desired band of frequencies, and said sum of said D.C. bias voltage and said microwave input signal having a magnitude exceeding said predetermined threshold magnitude, whereby said device is triggered into amplifying said microwave input signal.

3. Apparatus in accordance with claim 1, wherein said first end of said center conductor is at an electrical distance of substantially $\lambda/4$ from said first device terminal, where $\lambda$ is the wavelength at a desired frequency of operation.

4. Apparatus in accordance with claim 1, wherein said filter means includes a two-terminal band-stop filter resonant over said desired band of frequencies.

5. Apparatus according to claim 1, wherein said signal coupling means include an inductive coupling loop coupling electromagnetic energy generated by said semiconductive device to a terminal of a directive device resonant over said desired band of frequencies.

6. Apparatus according to claim 5, wherein said directive device includes in combination a directional circulator having first, second and third terminals, said first circulator terminal being connected to said output port, said second circulator terminal being connected to a first terminal of a band-pass filter resonant over said desired band of frequencies and having a second band-pass filter terminal connected to said inductive coupling loop, and said third circulator port being an input port for microwave input signals over said desired band of frequencies.

7. An apparatus according to claim 1, wherein said reverse bias signal includes a reverse D.C. voltage having a magnitude exceeding said predetermined threshold magnitude, whereby said device is triggered into generating energy in said anomalous mode of operation.

8. A microwave amplifier operative over a desired band of frequencies, said amplifier comprising:
   - a coaxial transmission line having a center conductor with first and second ends and a ground conductor, said center conductor being terminated at said first end by a microwave short circuit and at said second end by one terminal of a two-terminal band-stop filter resonant over a desired band of frequencies, a second terminal of said filter being connected to a microwave signal absorbing load,
   - a two-terminal negative resistance semiconductive device operative in the anomalous mode in response to a reverse bias signal exceeding a predetermined threshold level, said device having a first terminal connected to said center conductor at a point substantially $\lambda/4$ from said short circuit and substantially $\lambda/2$ from said one terminal of said band-stop filter, where $\lambda$ is the wavelength at the center frequency of said desired band of frequencies,
   - an inductive coupling loop having first and second ends, said first end being inductively coupled to said transmission line at a point of high magnetic current,
   - a two-terminal band-pass filter, having first and second terminals said filter being resonant over said desired band of frequencies, and having said first filter terminal connected to said second inductive coupling loop end,
   - means serially connected with said device for applying a D.C. reverse bias signal across said device terminals, said D.C. reverse bias signal having a magnitude less than said predetermined threshold magnitude, means connected to said second terminal of said band-pass filter for applying a microwave signal including said desired band of frequencies thereto for amplification at said device and for deriving said amplified signal for application to output means, said D.C. reverse bias signal and said microwave signal having a sum exceeding said predetermined threshold level causing said device to be triggered into operating in said anomalous mode.

* * * * *